United States Patent
Rakshit et al.

(10) Patent No.: US 11,871,194 B2
(45) Date of Patent: Jan. 9, 2024

(54) LEARNED ROLLABLE FLEXIBLE DEVICE SOUND CREATION

(71) Applicant: International Business Machines Corporation, Armonk, NY (US)

(72) Inventors: Sarbajit K. Rakshit, Kolkata (IN); Craig M. Trim, Ventura, CA (US); Martin G. Keen, Cary, NC (US); John M. Ganci, Jr., Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 17/448,217

(22) Filed: Sep. 21, 2021

(65) Prior Publication Data

US 2023/0092582 A1 Mar. 23, 2023

(51) Int. Cl.
- *G06F 1/16* (2006.01)
- *H04R 3/12* (2006.01)

(Continued)

(52) U.S. Cl.
CPC .............. *H04R 3/12* (2013.01); *G06F 1/1652* (2013.01); *H04R 1/028* (2013.01); *H04R 1/403* (2013.01);
(Continued)

(58) Field of Classification Search
CPC .......... H04R 3/12; H04R 1/028; H04R 1/403; H04R 2201/401; H04R 2499/15; G06F 3/16; G06F 1/1652
(Continued)

(56) References Cited

U.S. PATENT DOCUMENTS

| 4,799,264 A | * | 1/1989 | Plummer | ............... H04R 1/023 181/146 |
| 9,448,593 B2 | * | 9/2016 | Kim | ....................... G06F 1/1679 |

(Continued)

FOREIGN PATENT DOCUMENTS

| CN | 105286831 A | 2/2016 |
| CN | 108563551 A | 9/2018 |
| CN | 112532788 A | 3/2021 |

OTHER PUBLICATIONS

"Build smarter mobile services and applications using IBM Cloud", Downloaded May 20, 2021, 7 pages, <https://www.ibm.com/cloud/mobile>.

(Continued)

*Primary Examiner* — Disler Paul
(74) *Attorney, Agent, or Firm* — Randy Tejeda

(57) ABSTRACT

One or more computer processors detect a contextual need for sound generation on a rollable display device, wherein the rollable display device comprises an array of micro-speakers mounted on one or more microfluidics panels and a plurality of embedded piezoelectric strips. The one or more computer processors identify one or more environmental parameters associated with an environment surrounding the rollable display device. The one or more computer processors determine a rolling profile associated with the rollable based on the detected contextual need and the one or more identified environmental parameters. The one or more computer processors roll the rollable display device based on the determined rolling profile utilizing the plurality of piezoelectric strips. The one or more computer processors adjust an output direction of each micro-speaker in the array of micro-speakers utilizing the respective microfluidics panel.

17 Claims, 5 Drawing Sheets

(51) Int. Cl.
    *H04R 1/40*    (2006.01)
    *H04R 1/02*    (2006.01)
    *H04R 29/00*   (2006.01)
    *H10N 30/20*   (2023.01)

(52) U.S. Cl.
    CPC ..... *H04R 29/002* (2013.01); *H04R 2201/401* (2013.01); *H04R 2499/15* (2013.01); *H10N 30/20* (2023.02)

(58) Field of Classification Search
    USPC .................. 381/333, 104, 107, 388
    See application file for complete search history.

(56) References Cited

U.S. PATENT DOCUMENTS

| | | | |
|---|---|---|---|
| 9,730,318 B2 | 8/2017 | Choi | |
| 10,416,723 B2* | 9/2019 | Song | G06F 3/165 |
| 11,146,870 B2* | 10/2021 | Chopra | H04R 5/02 |
| 11,256,470 B1* | 2/2022 | Adoni | H04R 1/403 |
| 2007/0140518 A1 | 6/2007 | Larsen | |
| 2009/0027566 A1 | 1/2009 | Wargon | |
| 2014/0111549 A1* | 4/2014 | Vanska | G06F 1/1652 345/656 |
| 2016/0149547 A1* | 5/2016 | Rider | H03G 3/3005 381/57 |
| 2020/0402434 A1 | 12/2020 | Yamazuki | |
| 2021/0179223 A1 | 6/2021 | Charalampous | |
| 2021/0298647 A1* | 9/2021 | Axo | A61B 5/165 |

OTHER PUBLICATIONS

"Everything I need to know about flexible e-paper", Green Diary, Downlaoded May 20, 2021, 9 pages, <https://greendiary.com/flexible-paper.html>.

"Plastic Logic", © Plastic Logic 2021, 5 pages, <https://www.plasticlogic.com/>.

"Sound Interference and Resonance: Standing Waves in Air Columns", College Physics, Downloaded May 20, 2021, 16 pages, <https://opentextbc.ca/openstaxcollegephysics/chapter/sound-interference-and-resonance-standing-waves-in-air-columns/>.

"Speed of Sound—Resonance Tube", Copyright © 2012, 5 pages, <https://www.webassign.net/labsgraceperiod/asucolphysmechl1/lab_10/manual.html>.

Johnston, Casey, "Microfluidics panel could add physical buttons to a touch screen", Jan. 23, 2014, 3 pages, <https://arstechnica.com/gadgets/2014/01/new-microfluidics-panel-could-add-physical-buttons-to-a-touch-screen/>.

International Search Report and Written Opinion for International Application No. PCT/CN2022/119874, dated Nov. 29, 2022, 10 pages.

* cited by examiner

LEARNED ROLLABLE FLEXIBLE DEVICE SOUND CREATION

BACKGROUND

The present invention relates generally to the field of audio generation, and more particularly to audio generation in rollable display devices.

A flexible display or rollable display is an electronic visual display which is flexible in nature, as opposed to the traditional flat screen displays used in most electronic devices. Flexible or rollable display devices are utilized in e-readers, mobile phones and other consumer electronics. Such screens can be rolled up like a scroll without the image or text being distorted.

SUMMARY

Embodiments of the present invention disclose a computer-implemented method, a computer program product, and a system. The computer-implemented method includes one or more computer processers detecting a contextual need for sound generation on a rollable display device, wherein the rollable display device comprises an array of micro-speakers mounted on one or more microfluidics panels and a plurality of embedded piezoelectric strips. The one or more computer processors identify one or more environmental parameters associated with an environment surrounding the rollable display device. The one or more computer processors determine a rolling profile associated with the rollable based on the detected contextual need and the one or more identified environmental parameters. The one or more computer processors roll the rollable display device based on the determined rolling profile utilizing the plurality of piezoelectric strips. The one or more computer processors adjust an output direction of each micro-speaker in the array of micro-speakers utilizing the respective microfluidics panel.

DETAILED DESCRIPTION

Current rollable display devices suffer from limited sound effects utilizing micro-speakers as compared to traditional display devices with unrestricted device dimensions. For example, when a user is watching video or listening to audio content from a rollable display device, the creation of sound effects is limited due to the small size of micro-speakers required by rollable display devices. Moreover, the sound limitations of rollable display devices are compounded as flexible display devise are rolled into cylindrical or circular structures. These rolled devices are incapable of dynamic sounds effects, particularly as the rolled devices continue to change structure (i.e., roll or unroll).

Embodiments of the present invention include a rollable display device that analyzes a contextual need for creating a sound effect for audio or video content. Embodiments of the present invention include a rollable display device fixed with an array of fixed micro-speakers mounted upon a microfluidics panel. Embodiments of the present invention initiate a rollup of a portion of rollable display device (e.g., top or bottom, opposing sides, etc.) with enclosed embedded micro-speakers to create one or more air columns for enhanced sound generation. In this embodiment, the air column circumference and length are dynamically adjusted to alter the acoustic properties. Embodiments of the present invention utilize the dynamically created air columns to enhance sound properties based on the condition (e.g., roll structure) of the rollable flexible display device and environmental parameters. Implementation of embodiments of the invention may take a variety of forms, and exemplary implementation details are discussed subsequently with reference to the Figures.

The present invention will now be described in detail with reference to the Figures.

Figure 1:
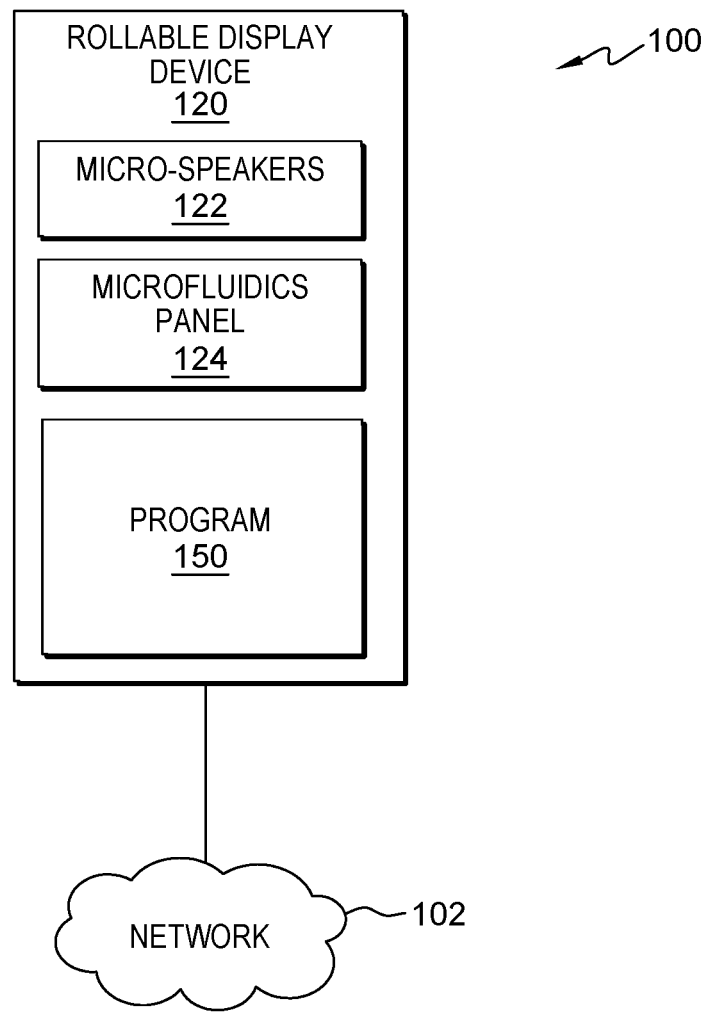
FIG. 1 (i.e., FIG.) is a functional block diagram illustrating a distributed data processing environment, in accordance with an embodiment of the present invention.

FIG. 1 is a functional block diagram illustrating a distributed data processing environment, generally designated 100, in accordance with one embodiment of the present invention. The term "distributed" as used in this specification describes a computer system that includes multiple, physically, distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes rollable display device 120 connected over network 102. Network 102 can be, for example, a telecommunications network, a local area network (LAN), a wide area network (WAN), such as the Internet, or a combination of the three, and can include wired, wireless, or fiber optic connections. Network 102 can include one or more wired and/or wireless networks that are capable of receiving and transmitting data, voice, and/or video signals, including multimedia signals that include voice, data, and video information. In general, network 102 can be any combination of connections and protocols that will support communications between rollable display device 120 and other computing devices (not shown) within distributed data processing environment 100. In various embodiments, network 102 operates locally via wired, wireless, or optical connections and can be any combination of connections and protocols (e.g., personal area network (PAN), near field communication (NFC), laser, infrared, ultrasonic, etc.).

Figure 3:
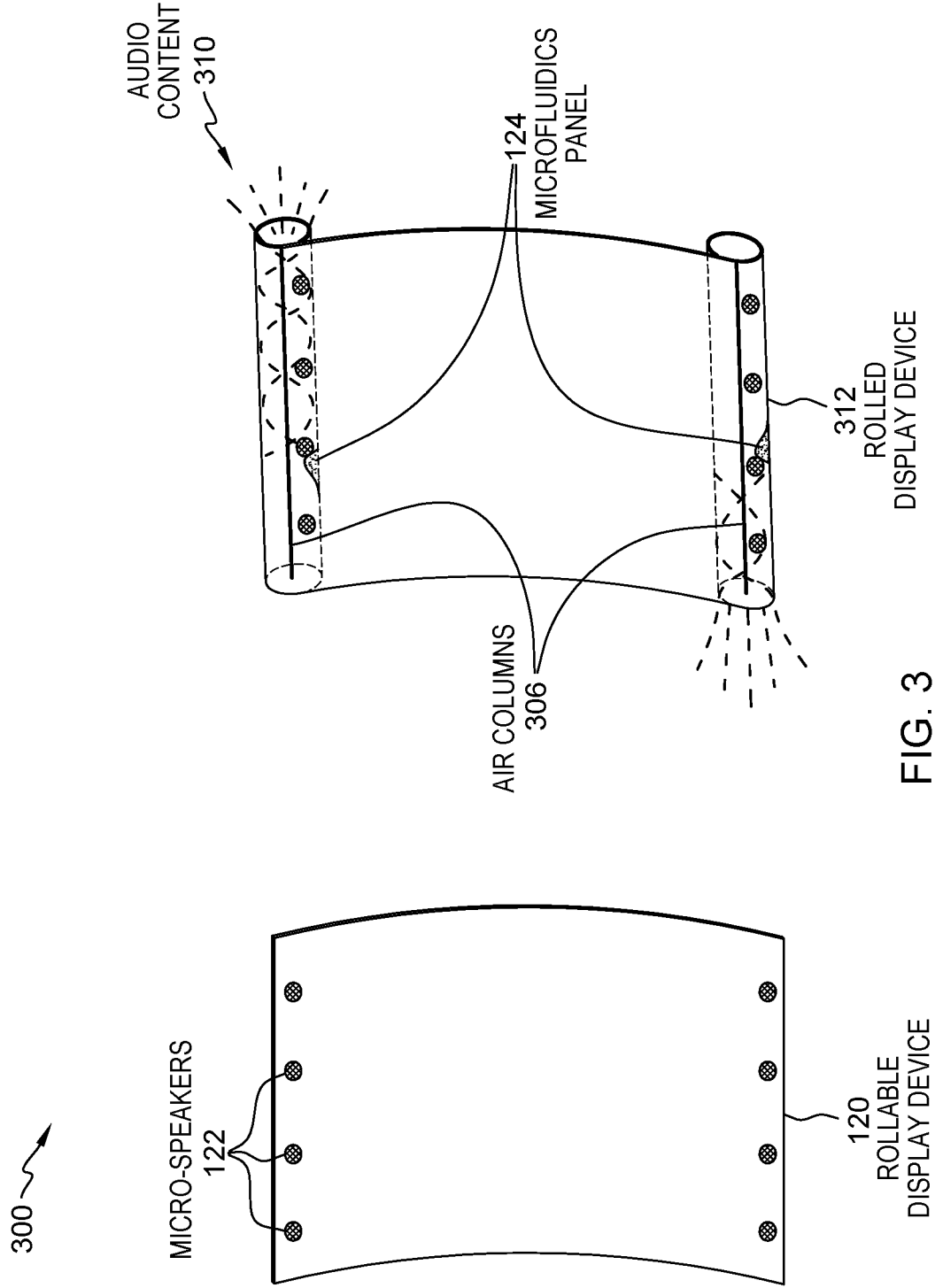
FIG. 3 is a diagram illustrating a rollable flexible device within the data processing environment of FIG. 1, in accordance with an embodiment of the present invention.

Rollable display device 120 can be a standalone computing device, a management server, a web server, a mobile computing device, or any other electronic device or computing system capable of receiving, sending, and processing data. In other embodiments, rollable display device 120 can represent a server computing system utilizing multiple computers as a server system, such as in a cloud computing environment. In another embodiment, rollable display device 120 can be a laptop computer, a tablet computer, a netbook computer, a personal computer (PC), a desktop computer, a personal digital assistant (PDA), a smart phone, or any programmable electronic device capable of communicating with other computing devices (not shown) within distributed data processing environment 100 via network 102. In another embodiment, rollable display device 120 represents a computing system utilizing clustered computers and components (e.g., database server computers, application server computers, etc.) that act as a single pool of seamless resources when accessed within distributed data processing environment 100. In the depicted embodiment, rollable display device 120 includes micro-speakers 122, microfluidics panel 124, and program 150. In an embodiment, rollable display device 120 contains a plurality of piezoelectric strips attached around the position of micro-speakers 122 or along the edges of rollable display device 120 (e.g., top, bottom, and/or opposing sides). In this embodiment, program 150 deforms the attached piezoelectric steps to initiate a rollup of rollable display device 120 in order to create an air column. In this embodiment, micro-speakers 122 are enclosed within the created air column. In a further embodiment, when program 150 applies an electric field, the piezoelectric strips are deformed. The deformation of the piezoelectric strips applies a mechanical force that causes rollable display device 120 to rollup, as depicted in FIG. 3. In other embodiments, rollable display device 120 may contain other applications, databases, programs, etc. which have not been depicted in distributed data processing environment 100. Rollable display device 120 may include internal and external hardware components, as depicted and described in further detail with respect to FIG. 5.

Micro-speakers 122 can be a device or an array of devices that convert an electrical audio signal into a corresponding sound. In an embodiment, micro-speakers 122 is any device capable of outputting audio. In an embodiment, micro-speakers 122 are located a plurality of micro-speaker rows, wherein each row is located on opposing ends of rollable display device 120, as shown in FIG. 3. In an embodiment, micro-speakers 122 situated directly on top of microfluidics panel 124. In this embodiment, micro-speakers 122 are located on the top and bottom of the surface of rollable display device 120. In another embodiment, micro-speakers 122 are located on each side of rollable display device 120. In a further embodiment, micro-speakers 122 are located on all four sides of rollable display device 120. In an embodiment, each micro-speaker within micro-speakers 122 is identified uniquely, has a defined position on rollable display device 120, and air column created by a rolled rollable display device 120. In this embodiment, micro-speakers 122 can be adjusted (e.g., sound direction) by microfluidics panel 124.

Microfluidics panel 124 is a microfluidics panel located in between the display surface of rollable display device 120 and micro-speakers 122. Microfluidics panel 124 contains a sub-layer punctured with a plurality of nano holes in which fluid is pressed upon to adjust flexible surface of rollable display device 120. Program 150 controls the flow of microfluidics channels contained in microfluidics panel 124 utilizing charge electro-osmosis. In an embodiment, program 150 utilizes an actuator that controls the microfluidics flow through a voltage differential. In this embodiment, program 150 applies microfluidics pressure to manipulate the surface of rollable display device 120, in turn allowing program 150 to adjust the directional properties of any generated sound originating from micro-speakers 122.

Program 150 is a program for generating audio content in a rollable display device. In various embodiments, program 150 may implement the following steps: detect a contextual need for sound generation on a rollable display device, wherein the rollable display device comprises an array of micro-speakers mounted on one or more microfluidics panels and a plurality of embedded piezoelectric strips; identify one or more environmental parameters associated with an environment surrounding the rollable display device; determine a rolling profile associated with the rollable based on the detected contextual need and the one or more identified environmental parameters; roll the rollable display device based on the determined rolling profile utilizing the plurality of piezoelectric strips; and adjust an output direction of each micro-speaker in the array of micro-speakers utilizing the respective microfluidics panel. In the depicted embodiment, program 150 is a standalone software program. In another embodiment, the functionality of program 150, or any combination programs thereof, may be integrated into a single software program. In some embodiments, program 150 may be located on separate computing devices (not depicted) but can still communicate over network 102. Program 150 is depicted and described in further detail with respect to FIG. 2.

The present invention may contain various accessible data sources that may include personal storage devices, data, content, or information the user wishes not to be processed. Processing refers to any, automated or unautomated, operation or set of operations such as collection, recording, organization, structuring, storage, adaptation, alteration, retrieval, consultation, use, disclosure by transmission, dissemination, or otherwise making available, combination, restriction, erasure, or destruction performed on personal data. Program 150 provides informed consent, with notice of the collection of personal data, allowing the user to opt in or opt out of processing personal data. Consent can take several forms. Opt-in consent can impose on the user to take an affirmative action before the personal data is processed. Alternatively, opt-out consent can impose on the user to take an affirmative action to prevent the processing of personal data before the data is processed. Program 150 enables the authorized and secure processing of user information, such as tracking information, as well as personal data, such as personally identifying information or sensitive personal information. Program 150 provides information regarding the personal data and the nature (e.g., type, scope, purpose, duration, etc.) of the processing. Program 150 provides the user with copies of stored personal data. Program 150 allows the correction or completion of incorrect or incomplete personal data. Program 150 allows the immediate deletion of personal data.

Figure 2:
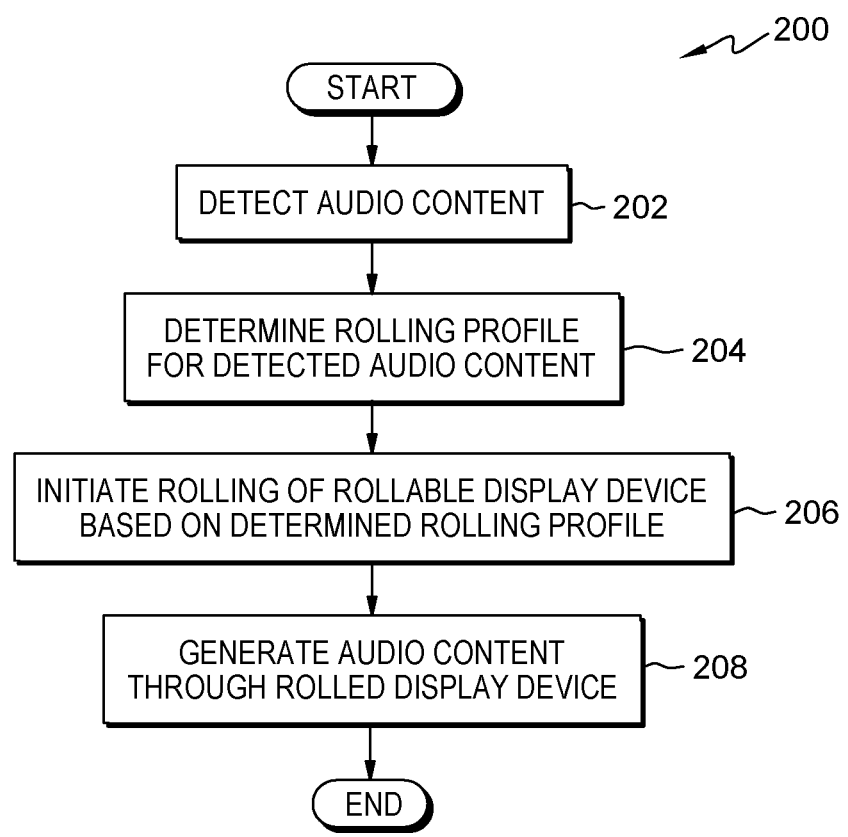
FIG. 2 is a flowchart depicting operational steps of a program, on a rollable display device within the data processing environment of FIG. 1, for generating audio content in a rollable display device, in accordance with an embodiment of the present invention.

FIG. 2 depicts flowchart 200 illustrating operational steps of program 150 for generating audio content in a rollable display device, in accordance with an embodiment of the present invention.

Program 150 detects audio content (step 202). In an embodiment, program 150 initiates responsive to a video or audio request on rollable display device 120. For example, the user initiates a request for video playback on rollable display device 120. In this example, program 150 extracts and analyzes the audio associated with the video playback (i.e., audio source). In further embodiment, program 150 applies an appropriate electric field to one or more embedded piezoelectric strips to programmatically initiate a preemptive roll of rollable display device 120. In an embodiment, program 150 detects a contextual need for the audio request and subsequent sound generation/output on rollable display device 120. In this embodiment, contextual need includes the requested audio, system preferences (e.g., system volume), user preferences, and application specific preferences (e.g., application volume in respect to the specific volumes of other running applications) associated with rollable display device 120, a user, or an application. In a further embodiment, program 150 identifies environmental parameters associated with an area containing rollable display device 120 (e.g., bedroom with rollable display device placed vertically on a dresser). In this embodiment, environmental parameters include, but are not limited to, area size, reflective surfaces in the area, reverberation time, acoustic adsorption rate, diffusion rate, and external noise sources. For example, program 150 utilizes an embedded camera (not depicted) to identify the surrounding area and, responsively, initiates acoustic testing to identify one or more environmental parameters.

Program 150 determines a rolling profile for detected audio content (step 204). In an embodiment, program 150, for a given audio source (e.g., a video, a podcast, a segment of music, etc.) performs a K nearest neighbor (kNN) classification analysis to derive acoustic properties for the audio source based upon known or historical audio emitting devices (i.e., rollable display device 120). In an embodiment, program 150 utilizes the kNN classification to derive the acoustic and device properties of nearest neighbors, providing peak resonance and air column specifications required for rollable display device 120 to mimic the nearest neighbors and associated properties. In an example, program 150 utilizes the kNN classification to derive a rolling profile that adds emphasis with increased bass or treble based upon increased external noise in the environment, where the rolling profile was provided by similar historical audio emitting devices. In an embodiment, the rolling profile includes required air column circumference and shape, rolling stop point(s), rolling direction, microfluidic adjusted micro-speaker directional outputs. In this embodiment, program 150 utilizes the kNN classification to derive the rolling profile based on current rolling position or shape (e.g., structure) of rollable display device 120, user preferences (e.g., emulate the acoustic properties of an external speaker), preferred decibel levels (i.e., acoustic properties for consistent volume in sound production), and identified environmental parameters (i.e., ensures sound effects will be clearly heard in a given environment). For example, the rolling profile dictates a cylindrical or conical air column with a narrow (e.g., 1 millimeter) circumference.

In another embodiment, program 150 communicates with other rollable display devices in the surrounding area to identify how the other rollable display devices create sound suitable for the surrounding area. In another embodiment, program 150 queries a known database for rolling profiles based on the hardware (e.g., number of speakers, speaker specifications, associated dynamic sound profiles, etc.) contained within rollable display device 120. For example, program 150 matches and retrieves a plurality of rolling profiles associated with heavy bass for speaker configurations that do not include amplifiers and/or sub-woofer capabilities. In another embodiment, program 150 generates the rolling profile based on user preferences, purposes (e.g., movie watching, music listening, etc.), available equipment (e.g., number of speakers, etc.) by combining known rolling profiles. For example, program 150 generates a novel rolling profile by combining a rolling profile that emphasizes a particular shape that adds bass with another rolling profile for a device with five speakers as opposed to the four speakers as required by the former rolling profile.

Program 150 rolls the rollable display device based on the determined rolling profile (step 206). Program 150 rolls rollable display device 120 according to the rolling profile determined in step 204. In an embodiment, rollable display device 120 contains a plurality of piezoelectric strips attached around the position of micro-speakers 122 and along the edges of rollable display device 120 (e.g., top, bottom, and/or opposing sides). In this embodiment, program 150 deforms the attached piezoelectric steps to initiate a rollup of rollable display device 120, in the correct rolling direction as dictated by the rolling profile, in order to create an air column dictated by the rolling profile. For example, program 150 initiates a rolling of rollable display device 120, such that both ends of rollable display device 120 roll at opposite ends, creating two air columns. In a further embodiment, each created air column has an enclosed micro-speaker. In another embodiment, program 150 applies an electric field causing the piezoelectric strips to deform, where the deformation of the piezoelectric strips applies a mechanical force that causes rollable display device 120 to rollup. In these embodiments, program 150 rolls rollable display device 120 to create an air column around micro-speakers 122. In an embodiment, program 150 dynamically adjusts the created air column to control one or more sound properties with resonance effects and produce different sound effects when audio is generated in different micro-speaker locations. In an embodiment, as program 150 rolls a portion of rollable display device 120 to create required sound effect, program 150 dynamically adjusts the display area of rollable display device 120 such that a user will continue to view displayed content without interruption from the rolling process. For example, a video playing on rollable display device 120 will scroll opposite the rolling direction at the same rolling rate, thus stabilizing video playback.

Program 150 generates requested audio content through the rolled device (step 208). Responsive to one or more created air columns through the dynamic rolling of rollable display device 120, program 150 utilizes microfluidics panel 124 to control the audio generation direction of each micro-speaker. In this embodiment, program 150 micro-speakers 122 are mounted on microfluidics panel 124, such that program 150 controls the direction of sound creation through micro-speakers 122 by electro-osmosis adjustments to microfluidics panel 124. In this embodiment, program 150 utilizes microfluidics panel 124 to separately control each micro-speaker encased in the created air column. In an embodiment, based on the required sound effect and rolling profile, program 150 selects one or more appropriate micro-speakers to selectively generate sound. For example, program 150 creates a 3D sound effect utilizing micro-speakers pointing at different locations within the created air column. In an embodiment, program 150 adjusts the direction of one or more micro-speakers and the air column (e.g., length or circumference) to add one or more sound alterations such as distortion, volume pedals, compressors, filters, modulation effects, pitch, and time effects (e.g., reverb and delay). For example, program 150 alters sound properties with resonance effect to increase sound and produce different sound effects when generated in different micro-speaker locations. Responsive to rolling, program 150 begins audio and/or video playback, such that the audio generated from micro-speakers 122 is synced correctly to a corresponding video.

FIG. 3 is a diagram illustrating a rollable flexible device in accordance with an embodiment of the present invention. FIG. 3 depicts diagram 300 comprising rollable display device 120. Rollable display device 120 comprises two rows of micro-speakers 122 respectively located on the top and bottom of rollable display device 120. Diagram 300 also comprises rolled display device 312. Program 150 creates rolled display device 312 by initiating a rolling of rollable display device 120 based on a determined rolling profile, as described in steps 204 and 206. This rolling creates air columns 306, encasing micro-speakers 122 on the top and bottom of rolled display device 312. Micro-speakers 122 are on mounted on top of microfluidics panel 124, where program 150 utilizes microfluidics panel 124 to adjust the output direction of micro-speakers 122, thus allowing program 150 to direct the output of audio content 310 from micro-speakers 122 within air column 306.

Figure 4:
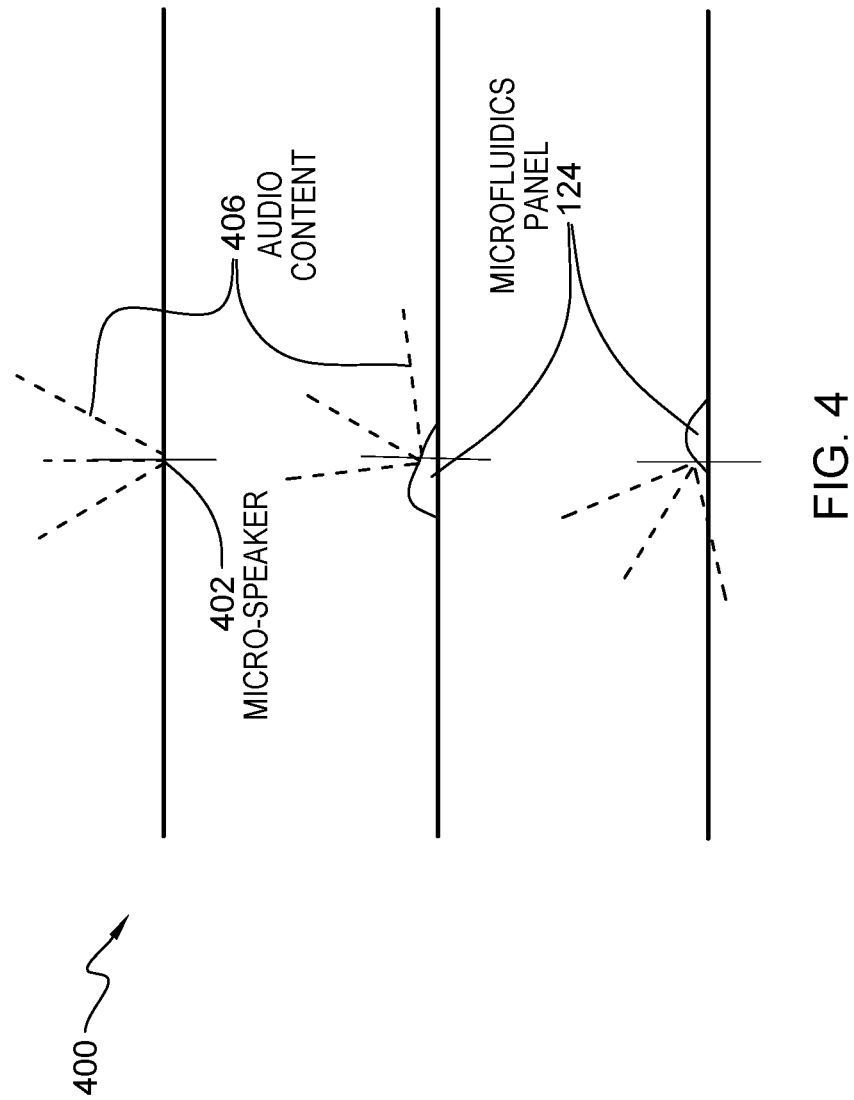
FIG. 4 is a diagram illustrating a micro-speaker upon a microfluidics panel within the data processing environment of FIG. 1, in accordance with an embodiment of the present invention.

FIG. 4 is a diagram illustrating a micro-speaker upon a microfluidics panel in accordance with an embodiment of the present invention. FIG. 4 depicts diagram 400 comprising micro-speaker 402 outputting audio content 406. Program 150 dynamically adjusts the output direction of audio content 406 through micro-speaker 402 utilizing microfluidics panel 124. Here, program 150 controls the flow of microfluidics channels contained in microfluidics panel 124 utilizing charge electro-osmosis. Program utilizes the microfluidics pressure to manipulate the surface of microfluidics panel 124 and thus the output direction of micro-speaker 402.

Figure 5:
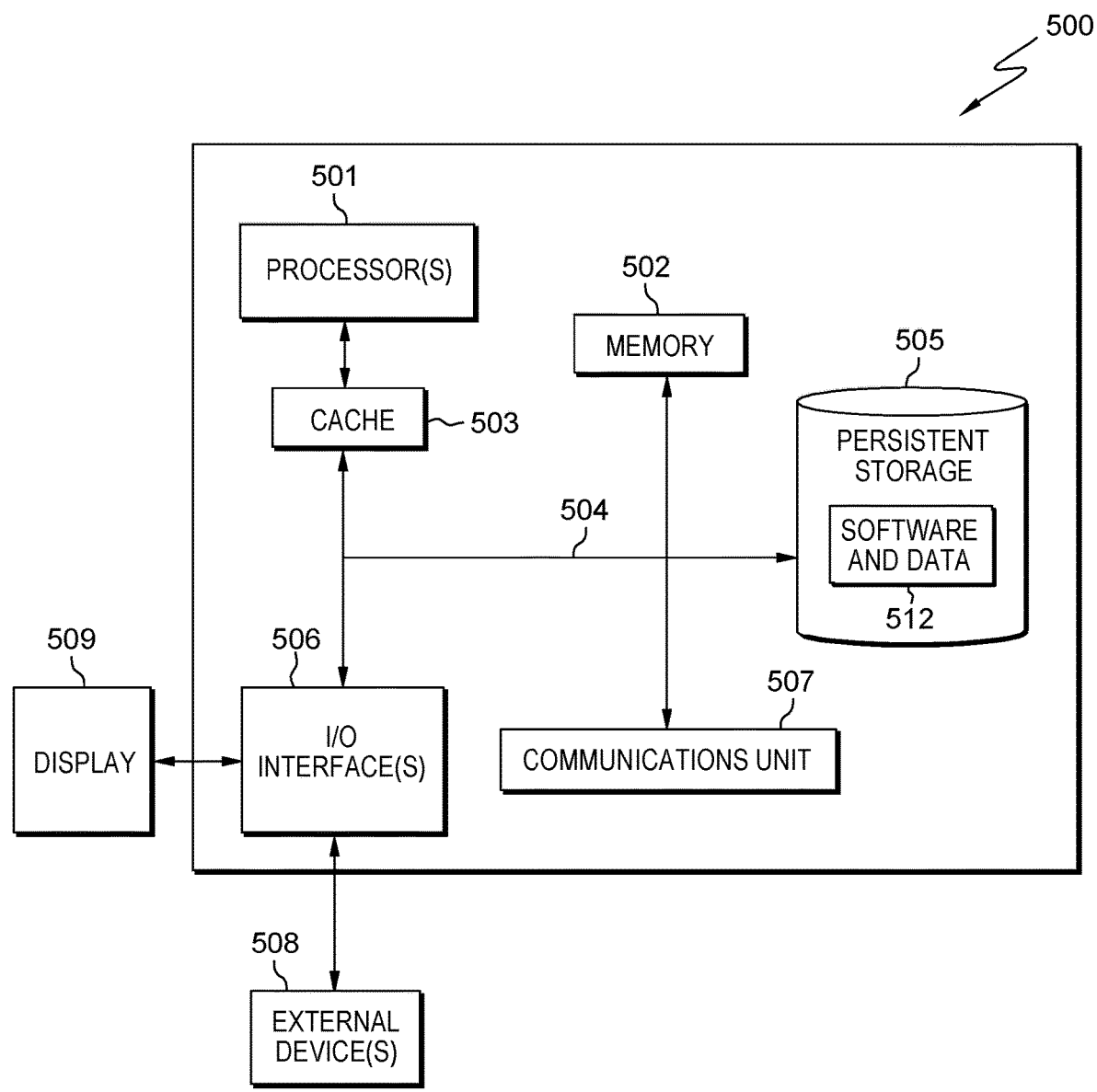
FIG. 5 is a block diagram of components of the rollable display device, in accordance with an embodiment of the present invention.

FIG. 5 depicts block diagram 500 illustrating components of rollable display device 120 in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Rollable display device 120 includes communications fabric 504, which provides communications between cache 503, memory 502, persistent storage 505, communications unit 507, and input/output (I/O) interface(s) 506. Communications fabric 504 can be implemented with any architecture designed for passing data and/or control information between processors (such as microprocessors, communications, and network processors, etc.), system memory, peripheral devices, and any other hardware components within a system. For example, communications fabric 504 can be implemented with one or more buses or a crossbar switch.

Memory 502 and persistent storage 505 are computer readable storage media. In this embodiment, memory 502 includes random access memory (RAM). In general, memory 502 can include any suitable volatile or non-volatile computer readable storage media. Cache 503 is a fast memory that enhances the performance of computer processor(s) 501 by holding recently accessed data, and data near accessed data, from memory 502.

Program 150 may be stored in persistent storage 505 and in memory 502 for execution by one or more of the respective computer processor(s) 501 via cache 503. In an embodiment, persistent storage 505 includes a magnetic hard disk drive. Alternatively, or in addition to a magnetic hard disk drive, persistent storage 505 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 505 may also be removable. For example, a removable hard drive may be used for persistent storage 505. Other examples include optical and magnetic disks, thumb drives, and smart cards that are inserted into a drive for transfer onto another computer readable storage medium that is also part of persistent storage 505. Software and data 512 can be stored in persistent storage 505 for access and/or execution by one or more of the respective processors 501 via cache 503.

Communications unit 507, in these examples, provides for communications with other data processing systems or devices. In these examples, communications unit 507 includes one or more network interface cards. Communications unit 507 may provide communications through the use of either or both physical and wireless communications links. Program 150 may be downloaded to persistent storage 505 through communications unit 507.

I/O interface(s) 506 allows for input and output of data with other devices that may be connected, respectively, to rollable display device 120. For example, I/O interface(s) 506 may provide a connection to external device(s) 508, such as a keyboard, a keypad, a touch screen, and/or some other suitable input device. External devices 508 can also include portable computer readable storage media such as, for example, thumb drives, portable optical or magnetic disks, and memory cards. Software and data used to practice embodiments of the present invention, e.g., program 150, can be stored on such portable computer readable storage media and can be loaded onto persistent storage 505 via I/O interface(s) 506. I/O interface(s) 506 also connect to a display 509.

Display 509 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, conventional procedural programming languages, such as the "C" programming language or similar programming languages, and quantum programming languages such as the "Q" programming language, Q#, quantum computation language (QCL) or similar programming languages, low-level programming languages, such as the assembly language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method comprising:
   detecting, by one or more computer processors, a contextual need for sound generation on a rollable display device, wherein the rollable display device comprises an array of micro-speakers mounted on one or more microfluidics panels and a plurality of embedded piezoelectric strips;
   identifying, by one or more computer processors, one or more environmental parameters associated with an environment surrounding the rollable display device;
   determining, by one or more computer processors, a rolling profile associated with the rollable based on the detected contextual need and the one or more identified environmental parameters, further comprising:
     deriving, by one or more computer processors, the rolling profile to mimic acoustic properties associated with one or more nearest neighbors utilizing a K nearest neighbor (kNN) classification analysis based upon one or more historical audio emitting devices;
   initiating, by one or more computer processors, a roll of the rollable display device by applying an electric field based on the determined rolling profile to the plurality of embedded piezoelectric strips within the rollable display device; and adjusting, by one or more computer processors, an output direction of each micro-speaker in the array of micro-speakers utilizing the respective microfluidics panel.

2. The computer-implemented method of claim 1, wherein rolling the rollable display device based on the determined rolling profile utilizing the plurality of piezoelectric strips, comprises:

deforming, by one or more computer processors, the one or more piezoelectric strips in the plurality of piezoelectric strips through an applied electric field, wherein the deformation of the one or more piezoelectric strips applies a mechanical force rolling the rollable display device.

3. The computer-implemented method of claim 1, wherein the rolling profile comprises required air column circumference, air column shape, rolling stop point, rolling direction, and micro-speaker directional outputs.

4. The computer-implemented method of claim 1, wherein rolling the rollable display device based on the determined rolling profile utilizing the plurality of piezoelectric strips creates one or more air columns dictated by the determined rolling profile.

5. The computer-implemented method of claim 1, wherein the environmental parameters comprise an environment size, reflective surfaces in the environment, reverberation time, acoustic adsorption rate, diffusion rate, and external noise sources.

6. The computer-implemented method of claim 1, further comprising:

dynamically adjusting, by one or more computer processors, one or more micro-speakers and one or more air columns to add one or more sound alterations to the sound generation.

7. A computer program product comprising:

one or more computer readable storage media and program instructions stored on the one or more computer readable storage media, the stored program instructions comprising:

program instructions to detect a contextual need for sound generation on a rollable display device, wherein the rollable display device comprises an array of micro-speakers mounted on one or more microfluidics panels and a plurality of embedded piezoelectric strips;

program instructions to identify one or more environmental parameters associated with an environment surrounding the rollable display device;

program instructions to determine a rolling profile associated with the rollable based on the detected contextual need and the one or more identified environmental parameters, wherein the program instructions further comprise:

program instructions to derive the rolling profile to mimic acoustic properties associated with one or more nearest neighbors utilizing a K nearest neighbor (kNN) classification analysis based upon one or more historical audio emitting devices;

program instructions to initiate a roll of the rollable display device by applying an electric field based on the determined rolling profile to the plurality of embedded piezoelectric strips within the rollable display device; and program instructions to adjust an output direction of each micro-speaker in the array of micro-speakers utilizing the respective microfluidics panel.

8. The computer program product of claim 7, wherein the program instructions, to wherein roll the rollable display device based on the determined rolling profile utilizing the plurality of piezoelectric strips, comprise:

program instructions to deform the one or more piezoelectric strips in the plurality of piezoelectric strips through an applied electric field, wherein the deformation of the one or more piezoelectric strips applies a mechanical force rolling the rollable display device.

9. The computer program product of claim 7, wherein the rolling profile comprises required air column circumference, air column shape, rolling stop point, rolling direction, and micro-speaker directional outputs.

10. The computer program product of claim 7, wherein the program instructions to roll the rollable display device based on the determined rolling profile utilize the plurality of piezoelectric strips creates one or more air columns dictated by the determined rolling profile.

11. The computer program product of claim 7, wherein the environmental parameters comprise an environment size, reflective surfaces in the environment, reverberation time, acoustic adsorption rate, diffusion rate, and external noise sources.

12. The computer program product of claim 7, wherein the program instructions, stored on the one or more computer readable storage media, further comprise:

program instructions to dynamically adjust one or more micro-speakers and one or more air columns to add one or more sound alterations to the sound generation.

13. A computer system comprising:

one or more computer processors;

one or more computer readable storage media; and program instructions stored on the computer readable storage media for execution by at least one of the one or more processors, the stored program instructions comprising:

program instructions to detect a contextual need for sound generation on a rollable display device, wherein the rollable display device comprises an array of micro-speakers mounted on one or more microfluidics panels and a plurality of embedded piezoelectric strips;

program instructions to identify one or more environmental parameters associated with an environment surrounding the rollable display device;

program instructions to determine a rolling profile associated with the rollable based on the detected contextual need and the one or more identified environmental parameters, wherein the program instructions further comprise:

program instructions to derive the rolling profile to mimic acoustic properties associated with one or more nearest neighbors utilizing a K nearest neighbor (kNN) classification analysis based upon one or more historical audio emitting devices;

program instructions to initiate a roll of the rollable display device by applying an electric field based on the determined rolling profile to the plurality of embedded piezoelectric strips within the rollable display device; and program instructions to adjust an output direction of each micro-speaker in the array of micro-speakers utilizing the respective microfluidics panel.

14. The computer system of claim 13, wherein the program instructions, to wherein roll the rollable display device based on the determined rolling profile utilizing the plurality of piezoelectric strips, comprise:

program instructions to deform the one or more piezoelectric strips in the plurality of piezoelectric strips through an applied electric field, wherein the deformation of the one or more piezoelectric strips applies a mechanical force rolling the rollable display device.

15. The computer system of claim 13, wherein the rolling profile comprises required air column circumference, air column shape, rolling stop point, rolling direction, and micro-speaker directional outputs.

16. The computer system of claim 13, wherein the program instructions to roll the rollable display device based on the determined rolling profile utilize the plurality of piezoelectric strips creates one or more air columns dictated by the determined rolling profile.

17. The computer system of claim 13, wherein the environmental parameters comprise an environment size, reflective surfaces in the environment, reverberation time, acoustic adsorption rate, diffusion rate, and external noise sources.

* * * * *